United States Patent [19]
Horiuchi et al.

[11] Patent Number: 5,702,807
[45] Date of Patent: Dec. 30, 1997

[54] CERAMIC CIRCUIT BOARD AND MANUFACTURING METHOD THEREOF

[75] Inventors: Michio Horiuchi; Yoichi Harayama, both of Nagano, Japan

[73] Assignee: Shiko Electric Industries Co., Ltd., Nagano, Japan

[21] Appl. No.: 734,315

[22] Filed: Oct. 21, 1996

Related U.S. Application Data

[63] Continuation of Ser. No. 399,348, Mar. 3, 1995, abandoned.

[30] Foreign Application Priority Data

Mar. 3, 1994 [JP] Japan .................. 6-033652

[51] Int. Cl.$^6$ ................. B32B 3/00; H05K 1/03
[52] U.S. Cl. ............... 428/210; 428/209; 428/901; 174/256
[58] Field of Search ............. 428/209, 910, 428/210; 174/256

[56] References Cited

U.S. PATENT DOCUMENTS

| | | | |
|---|---|---|---|
| 4,490,429 | 12/1984 | Tosaki | 428/210 |
| 4,608,316 | 8/1986 | Toda | 428/901 |
| 5,139,852 | 8/1992 | Baise | 428/210 |
| 5,229,213 | 7/1993 | Horiuchi et al. | |

FOREIGN PATENT DOCUMENTS

| | | |
|---|---|---|
| 0 444 216 | 9/1991 | European Pat. Off. |
| 0 587 382 | 3/1994 | European Pat. Off. |
| 3-276797 | 12/1991 | Japan |

OTHER PUBLICATIONS

Patent Abstracts of Japan; A 5235549; vol. 17, No. 691 (Dec. 1993).
Patent Abstracts of Japan; A 3276797; vol. 16, No. 96 (Mar. 1992).
"Base Metal Thick Film Condutors", S.J. Stein, et al.; pp. 73–79.
U.S. application No. 08/115,767, Horiuchi et al., filed Sep. 3, 1993, Assignee Shinko Electric Industries Co., Ltd.
U.S. application No. 08/265,028, Horiuchi et al., filed Jun. 24, 1994, Assignee Shinko Electric Industries Co., Ltd.

*Primary Examiner*—Patrick Ryan
*Assistant Examiner*—Cathy F. Lam
*Attorney, Agent, or Firm*—Staas & Halsey

[57] ABSTRACT

A conductor circuit 12 made of aluminum is provided on a green sheet 10, the primary material of which is ceramic powder. The green sheets 10 are laminated and integrated into one body so that the conductor circuit 12 is not exposed onto the surface but is covered with the green sheet 10. The laminated body is fired at the firing temperature not lower than 660° C. and a portion of the inner conductor circuit of the thus obtained sintered body is then exposed onto a surface of the substrate.

5 Claims, 1 Drawing Sheet

CERAMIC CIRCUIT BOARD AND MANUFACTURING METHOD THEREOF

This application is a continuation, of application Ser. No. 08/399,348, filed Mar. 3, 1995, now abandoned.

BACKGROUND OF THE INVENTION

1. Field of the Invention

The present invention relates to a ceramic circuit board onto which semiconductor elements are assembled, and also relates to a manufacturing method of such a ceramic circuit board.

2. Description of the Related Art

As the processing speed of semiconductor devices has recently increased and the semiconductor devices have become highly integrated, various characteristics are required of circuit boards and semiconductor packages so as to meet these demands. One of the demands is to reduce the conductor resistance. In accordance with the demand, the ceramic circuit boards have been developed, in which copper, gold and silver are used, the resistances of which are lower than that of conventionally used tungsten. Ceramics capable of being fired simultaneously with the conductor material of low resistance are generally referred to as low temperature fired ceramics and are primarily composed of crystalized glass or composed of a mixture of glass and ceramics, capable of being sufficiently fluidized at a temperature not higher than 1000° C. In order to obtain the inner conductor circuit, it is necessary to simultaneously fire the conductor material and ceramics. In order to accomplish a highly dense assembly, it is necessary to provide an inner conductor circuit.

In this connection, gold and silver are conductor materials of low resistance capable of being fired simultaneously with the low temperature fired ceramics, such as taught in U.S. Pat. No. 5,229,213 issued on Jul. 20, 1993. Gold and silver have an advantage in that they can be simultaneously fired in the atmosphere, however, they are disadvantageous in that the material costs are high. Therefore, ceramic circuit boards in which gold is used as a conductor material are seldom put into practical use. In the case where silver is used as a conductor material, the problem of migration is caused. Therefore, a portion exposed onto the surface must contain a material such as palladium for suppressing the occurrence of migration. In this case, the conductor resistance of the wiring pattern is disadvantageously increased.

In the case where copper is used as a conductor material, copper is advantageous in that the material cost is lower than that of gold or silver. However, when copper is employed, it is necessary to fire in the non-oxidizing atmosphere. Therefore, it is very difficult to remove an organic component from the ceramic green sheet. For this reason, the firing time becomes longer than that of the conventional alumina ceramics, so that the productivity is lowered and the production cost is increased. Further, in the case of firing in the non-oxidizing atmosphere, fluidization starts before an organic component is removed from the green sheet, so that the residue remains in the circuit board in the form of carbon, which deteriorates the characteristics of the circuit board, and especially deteriorates the electrical characteristics of the circuit board.

SUMMARY OF THE PRESENT INVENTION

The present invention has been achieved to solve the above problems. It is an object of the present invention to provide a ceramic circuit board and a manufacturing method thereof, by which the conductor material thereof can be made of aluminum that is excellent in the electric resistance, heat conductivity, specific gravity and material cost.

In order to accomplish the above object, the present invention is provided with the following structure. The present invention is to provide a ceramic circuit board comprising: an insulating substrate made of ceramic; and a conductor circuit formed on the insulating substrate, wherein at least an inner conductor circuit provided in the insulating base is made of aluminum formed together with the ceramics by means of simultaneous firing.

Ceramics primarily composed of at least one of alumina, mullite, cordierite and aluminum nitride is preferably employed because it is excellent in thermal characteristics, electrical characteristics and in mechanical strength.

Ceramics primarily composed of at least one of alumina, mullite, cordierite, aluminum nitride and silica and also composed of glass containing silica are preferably employed because they can provide excellent thermal and electrical characteristics and sufficient mechanical strength by firing at a lower temperature, that is, at a lower cost.

The ceramic circuit board in which a portion of the inner conductor circuit is exposed onto the surface by means of grinding the ceramics is preferably employed because the surface conductor circuit can be easily formed in the later process by means of screen printing, sputtering or vapor-depositing.

The ceramic circuit board in which the surface conductor circuit, provided on the circuit board and connected with the inner conductor circuit, is preferably formed by a thick film or a thin film method because a highly dense circuit structure can be provided.

The present invention is to provide a manufacturing method of manufacturing a ceramic circuit board comprising the steps of: providing a conductor circuit made of aluminum on a green sheet primarily made of ceramic powder; laminating and integrating the green sheets into one body, wherein the conductor circuit is covered with the green sheet so that the conductor circuit is not exposed onto the surface; firing the green sheets at a temperature not lower than 660° C.; and exposing a portion of the inner conductor circuit of the sintered body obtained by means of firing onto the surface of the circuit board.

It is preferable to employ a method of manufacturing a ceramic circuit board in which a primary component of the green sheet is ceramic powder primarily composed of at least one of alumina, mullite, cordierite or aluminum nitride because it is excellent in thermal characteristics, in electrical characteristics and in mechanical strength.

It is preferable to employ a method of manufacturing a ceramic circuit board in which the primary components of the green sheet are ceramic powder primarily composed of at least one of alumina, mullite, cordierite, aluminum nitride and silica, and glass powder containing silica because they can provide excellent thermal and electrical characteristics and sufficient mechanical strength by firing at a lower temperature, that is, at a lower cost.

It is preferable to employ a method of manufacturing a ceramic circuit board in which the green sheets are subjected to binder-removing-treatment in an atmosphere, the temperature of which is not higher than 500° C., after the green sheets have been laminated and integrated into one body, and the body is fired in a non-oxidizing atmosphere because the manufacturing time can be shortened and the manufacturing cost can be reduced.

It is preferable to employ a method of manufacturing a ceramic circuit board in which a portion of the inner conductor circuit is exposed onto the surface of the circuit board when a sintered body obtained by firing is ground after the firing process because the surface conductor circuit can be easily formed in a later process by means of screen printing, sputtering or vapor-depositing.

It is preferable to employ a method of manufacturing a ceramic circuit board in which a surface conductor circuit, connected with the inner conductor circuit, is formed on the surface of the circuit board by a thick film or a thin film method after a portion of the inner conductor circuit has been exposed onto the surface of the circuit board because a highly dense circuit structure can be provided.

DETAILED DESCRIPTION OF THE INVENTION

Figure 1A:
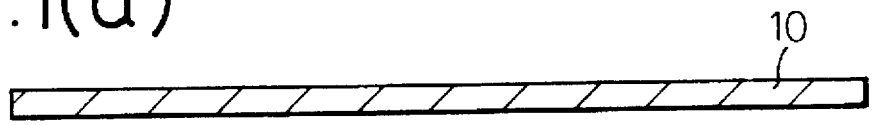
FIGS. 1(a) through 1(f) are schematic illustrations showing an example of he method of manufacturing the ceramic circuit board according to the present invention.

Conventionally, aluminum is not used as a conductor material to be fired simultaneously with ceramics. The reasons are as follows: First, the melting point of aluminum is approximately 660° C., which is much lower than the firing temperature (about 1000° C.) of low temperature fired ceramics. Secondly, aluminum is a metal that is apt to oxidize. Thirdly, aluminum tends to generate nitride and carbide under a non-oxidizing condition for preventing oxidization.

As described above, according to the conventional method, it is impossible to use aluminum as a conductor material for simultaneous firing, however, aluminum has appropriate properties for electronic use. For example, the specific resistance is $2.7 \times 10^{-6}$ $\Omega$ cm, not more than a half of the specific resistance of tungsten (about $5.6 \times 10^{-6}$ $\Omega$ cm). The specific resistance of aluminum is approximate to the specific resistance of gold (about $2.2 \times 10^{-6}$ $\Omega$ cm). The heat conductivity of aluminum is approximately 200 $Wm^{-1} K^{-1}$ and is higher than the heat conductivity of tungsten, and the specific gravity of aluminum is approximately 2.7, far lower than the specific gravity of any of the conventional conductor materials. Further, the material cost of aluminum is lower than the material cost of any of the conventional conductor materials.

The inventors took into consideration the advantages and disadvantages of aluminum when it is used as a material for electronic use, and made various investigations. Finally, they accomplished the present invention by solving the following problems: When aluminum and ceramics are simultaneously fired, aluminum is melted and fluidized at about 660° C. On the other hand, ceramics is not fluidized at this temperature, and the following problems are caused.

(1) Vaporization loss of molten and liquidized aluminum.

(2) Chemical reactions between aluminum and the primary component of the ceramic or the auxiliary assistant component.

(3) Penetration of molten aluminum into the particles of the ceramic by capillary action.

(4) Diffusion of aluminum into the ceramic (interface or grid).

(5) Chemical reaction between the residual organic component and aluminum, especially the generation of carbide.

(6) Dissolution of the principle component of the ceramic, or the auxiliary assistant component, into molten aluminum.

(7) Chemical reaction between aluminum and the atmosphere in the firing process. Especially, the generation of an oxide, a nitride or an oxi-nitride.

(8) Stress generated by the difference in the thermal expansion coefficients of aluminum and the ceramic.

(9) Difference of volumetric changes in aluminum and the ceramic during the entire process.

Concerning item (1) relating to the vaporization loss of aluminum, consideration must be given to the range of temperatures, not lower than 660° C., at which aluminum is liquidized. In the case of ceramics with high firing temperatures, this problem of vaporization loss becomes serious since the vapor pressure of aluminum is raised.

Concerning item (2) relating to the chemical reaction between aluminum and ceramic by which a chemical compound is generated, it can be considered that an aluminum silicate compound or aluminate of alkaline earth or oxide-nitride of these compounds is generated, and the atmosphere in the firing process affects the generation of these compounds.

Concerning item (3) relating to the penetration of molten aluminum into the particles of the ceramic, the penetration of molten aluminum is affected by the wettability of component particles of the ceramic with respect to molten aluminum. It is known that the wettability is correlated to the surface structure of the ceramic particles, the level of impurities contained in the aluminum, and the atmosphere.

Concerning item (5) relating to the chemical reaction between the residual organic component and aluminum, the generation of carbide finally causes a problem. With respect to the form of carbide, $Al_4C_3$ and $Cl_2C_6$ are well known.

Concerning item (6) relating to the dissolution of various components of oxide into the medium of molten aluminum, this dissolution directly deteriorates the electrical and thermal characteristics of aluminum.

Concerning item (7) relating to the chemical reaction between the firing atmosphere and aluminum, the generation of oxide, nitride and oxi-nitride causes a problem, and oxide is generated at room temperature and nitride is generated at approximately the liquidizing temperature.

Concerning item (8) relating to the stress generated by the different thermal expansion coefficients of aluminum and the ceramic, the thermal expansion coefficient of aluminum is approximately $23 \times 10^{-6}$/°C., higher than that of copper ($17 \times 10^{-6}$/°C.). Therefore, it is thought that the stress generated by the thermal expansion coefficient of aluminum is higher than that generated in the case of simultaneous firing of copper and low temperature fired ceramic. However, the stress caused by the difference in the thermal expansion coefficient is actually generated when aluminum is cooled from the temperature of resolidification to the room temperature. Since the Young's modulus of aluminum (about $7 \times 10^3$ $Kgmm^{-2}$) is lower than that of copper (about $11 \times 10^3$ $Kgmm^{-2}$), it is considered that the stress caused by the difference in the thermal expansion coefficient causes no problem if an area of the interface between aluminum and ceramics is not more than a predetermined value which can be practically applied.

Concerning item (9) relating to the difference in a volumetric change during the overall process between aluminum and ceramics, the difference is caused by the charging ratio of aluminum and that of ceramics. In general, after ceramics has been fired, voids are produced in ceramic, the volumetric ratio of which is several percent. On the other hand, after aluminum has been liquidized, its density is approximately increased to 100 percent. Accordingly, when the charging ratio of ceramic and that of aluminum are the same before the firing, or when the charging ratio of aluminum is insufficient, voids are produced after the completion of firing. On the contrary, when the charging ratio of aluminum is excessively higher than that of the ceramic, a surplus amount of molten aluminum is generated in the process of firing, so that stress is generated between aluminum and the ceramic. Accordingly, it is preferable that the charging ratio of aluminum at the green stage before firing satisfies the following expression.

[Charging ratio of aluminum]% =100%−[(Charging ratio of ceramics after firing)−(Charging ratio of ceramics at the green stage)]%

Consideration was given to the above various points. As a result, the following manufacturing method is employed in the present invention.

The manufacturing method comprises the steps of: providing a conductor circuit of plane wiring and/or via wiring on green sheets made of ceramic powder; laminating one layer or a plurality of layers of the green sheets on which these conductor circuits are provided; and covering the conductor circuit with a green sheet on which a conductor circuit is not provided so that the conductor circuit is not exposed onto the surface; and firing the green sheets at a temperature in a range from 660° C. to 1800° C.

In this case, examples of usable ceramics capable of being fired at a temperature not more than 1800° C. are: alumina ceramics, mullite ceramics, and aluminum nitride ceramics. Alternatively, examples of usable ceramics capable of being fired at a temperature not more than 1800° C. are: low temperature fired ceramics capable of densification at a temperature not more than 1100° C., wherein the primary components of the ceramics are at least one crystal phase of alumina ($Al_2O_3$), silica ($SiO_2$), mullite ($3Al_2O_3 \cdot 2SiO_2$), aluminum nitride (AlN) and cordierite ($2MgO \cdot 2Al_2O_3 \cdot 5SiO_2$), and the glass phase containing silica.

In this case, it is preferable that the aluminum material used for formation of the conductor circuit is as pure as possible. The reason is described as follows: When aluminum contains a large amount of impurities, the melting point is generally lowered, and the wettability of molten aluminum with respect to ceramic powder is changed and further the electrical characteristics are deteriorated.

According to the present invention, aluminum exists in the form of liquid at a stage in which ceramic has not been densified in the process of firing. An example in which molten metal and ceramics are simultaneously fired is disclosed in U.S. Pat. No. 5,229,213 issued on Jul. 20, 1993 by the same inventors of this application. In the disclosure, a conductor material of gold, copper or silver is fired simultaneously with ceramics so as to form a circuit board made of aluminum nitride. The manufacturing method of manufacturing the ceramic circuit board to which the present invention is applied includes some of the phenomena similar to the method disclosed in the patent publication described above. However, the physical and chemical properties of aluminum are greatly different from those of copper and other metals. Therefore, when aluminum is applied, some investigations must be made in the manufacturing technique. In this connection, the most different points between the property of aluminum and that of copper are described as follows: The melting point of aluminum is lower than that of copper by more than 400° C., and aluminum tends to be subjected to nitriding or carbonization.

In the present invention, since aluminum is liquidized at about 660° C., a relatively low temperature, it is necessary to use ceramics having the following physical properties: The ceramic is capable of densification at a temperature as low as possible. The ceramics starts to densify at a temperature as low as possible. The liquid phase is generated at a temperature as low as possible. Densification of the ceramic is completed in as short a period of time as possible.

In general, low temperature fired ceramic is capable of densifying at a temperature not higher than 1000° C. However, in order to sufficiently densify alumina ceramics or mullite ceramics, it is necessary to fire at a temperature not lower than 1500° C., and in order to sufficiently densify aluminum nitride ceramics, it is necessary to fire at a temperature not lower than 1600° C. As described above, the firing temperature is very high. Therefore, it is preferable that the densification start temperature is as low as possible, the particle size of powder material is as small as possible so as to increase the densification speed, and an appropriate assistant is added so that the liquid phase is generated at a temperature as low as possible, that is, the liquid phase is generated at a temperature not higher than 1300° C.

However, when the thus obtained ceramic is fired in a non-oxidizing atmosphere such as a nitrogen atmosphere or a moist reducing nitrogen atmosphere, it is difficult to remove the organic component from the green sheet, that is, the binder-removing property is not good. Therefore, depending on the condition, the densification of the ceramic is remarkably obstructed, and further aluminum is subjected to carbonization by the residual carbon. At a temperature not lower than the melting point of aluminum, especially at a temperature not lower than 900° C., aluminum tends to be subjected to nitriding in the atmosphere of nitrogen. On the other hand, in the moist atmosphere, at least in the conventional firing condition of alumina ceramic, the binder-removing property is improved, however, aluminum is subjected to oxidization or nitriding, and the reactant of aluminum penetrates into the ceramics and blistering occurs in the ceramics. However, it should be noted that the ceramic can also be fired in a normal atmosphere.

As described above, in the simultaneous firing of aluminum and ceramic, various properties such as a low melting point, carbonization, oxidization and nitriding affect each other and exert a negative influence.

In order to solve the above problems, according to the present invention, a binder-removing-treatment is carried out in air, the temperature of which is not higher than 500° C. Aluminum is apt to oxidize, and it oxidizes even at room temperature. Since an oxide film formed on the surface of aluminum at room temperature functions as a protective film, depending on the distribution of the grain size, in general, oxidization of aluminum progresses very gently at a temperature lower than 600° C. Due to the processing to form the protective oxide film on the surface, the generation of aluminum carbide caused by the residual organic component can be prevented, and further a period of time from the binder-removing-treatment to the firing process can be greatly shortened. Further, when the mechanical strength of the surface oxide film is appropriately enhanced, the liquidization temperature and the nitriding temperature can be raised, so that the degree of freedom of the process can be remarkably improved.

In general, the aluminum conductor circuit is made in such a manner that aluminum powder is made to be paste and printed on a board by the screen printing method. In this case, the distribution of the grain size of aluminum powder is very important for determining the process condition.

Since fine powder of aluminum is unstable from the chemical point of view, it is preferable to determine the grain size to be larger than the average gain size of metallic powder contained in copper paste or tungsten paste that is conventionally known as a conductor paste. In the case where the average grain size exceeds 50 μm, the printing property of aluminum paste is remarkably deteriorated. Therefore, it is preferable that the average grain size is at least not more than 50 μm. It is more preferable that the average grain size is approximately 10 μm.

In the aluminum conductor circuit provided by the method of the present invention, traces of penetration of aluminum can be seen in the ceramic. The degree of penetration of aluminum varies according to the grain size of aluminum, the binder-removing condition, the firing condition and the type of ceramic.

Concerning the type of ceramic, any of alumina ceramic, low temperature fired ceramics, aluminum nitride ceramics and mullite ceramics can be employed to form the aluminum conductor circuit. Aluminum nitride ceramics and mullite ceramics have a tendency of allowing penetration into the ceramic.

The primary reason is described as follows: In the case of aluminum nitride ceramics, the firing temperature is high, so that the vapor pressure of aluminum and the reactivity such as nitriding are increased at high temperature.

According to the investigation made by the present inventors, the following result was provided: The sintering assistant was composed of a mixture of a chemical compound of group IIa and a chemical compound of group IIIa on the periodic table, wherein the mixing ratio was 1:4 mole ratio. The temperature increase rate was increased to 30° C./min. The firing temperature was 1700° C. The firing time was 1 hour. Even in the aluminum nitride ceramics manufactured in the above conditions, the degree of aluminum penetration was higher than in the alumina ceramic that was fired for 2 hours at 1560° C.

In the case of mullite ceramics, the firing temperature is the same as that of alumina ceramic, however, the liquid phase generation start temperature of mullite ceramics is higher than that of alumina ceramics, which is considered to be the primary reason.

Accordingly, it is estimated that the characteristics of mullite, such as the mechanical strength, are deteriorated, but it is possible to reduce the penetration of aluminum by changing the composition and the amount of the sintering assistant.

In the aluminum conductor circuit provided by the present invention, in the aforementioned interaction generated between the molten metal and ceramics, the dissolution of a subsidiary component in the ceramic into the liquid aluminum causes a problem. This tendency depends on the subsidiary component concentration and the conditions of binder-removing and firing. Especially, this tendency depends greatly on the maximum firing temperature and the firing atmosphere. Specifically, the distribution of silicon penetrating into the aluminum conductor circuit formed in the alumina ceramic is most remarkably observed. In this case, the distribution of silicon in the aluminum conductor circuit is not uniform, but silicon is locally distributed, and the distribution of oxygen or nitrogen does not necessarily coincide with the distribution of silicon. Accordingly, there is a high possibility that silicon penetrating into aluminum does not exist in the form of an oxide or a nitride.

When a surface of the ceramic sintered body including the thus obtained aluminum inner conductor circuit is ground or polished, a portion of the inner conductor circuit provided in the sintered body is exposed onto the surface. The inner conductor circuit includes a plane and a via circuit. In many cases, it is only necessary to expose an end face of the via circuit onto the surface.

Successively, a surface conductor circuit or a pad-shaped surface terminal is formed, with which the exposed portion of the inner conductor circuit is connected. In the case of the circuit board according to the present invention, the melting point of the conductor is low, so that the thin film method such as a sputtering method is preferably employed. Not only grinding but also cutting, ultrasonic machining and laser beam machining may be employed for exposing the inner conductor circuit onto the surface of the sintered body.

Depending on the type of metal provided by the thin film method on the end face of an aluminum inner conductor circuit such as a via conductor circuit, it is necessary to prevent the occurrence of mutual diffusion. Aluminum does not directly cause a harmful interaction with polyimide. Therefore, even when the surface conductor circuit of a thin aluminum film is formed, or even when the via is used as a thermal via in the ceramics, it is not necessary to provide a barrier layer or an adhesive layer on aluminum. From this point of view, the cost of the aluminum conductor circuit is beneficially lower than that of the copper conductor circuit which requires a barrier layer made of nickel or chromium.

In this way, a ceramic circuit board can be provided which has a surface conductor circuit in which aluminum is used for the conductor of the inner conductor circuit. When necessary, an outer lead and seal ring my be attached so that a package for use in the semiconductor apparatus can be formed. In the present invention, both aluminum and conducting metals other than for aluminum my be simultaneously used in the inner conductor circuit or the surface conductor circuit.

EXAMPLE 1

FIGS. 1(a) through 1(f) show an example of the manufacturing method of the ceramic circuit board of the invention. In this example, alumina ceramic is used for the insulating substrate.

Figure 1B:
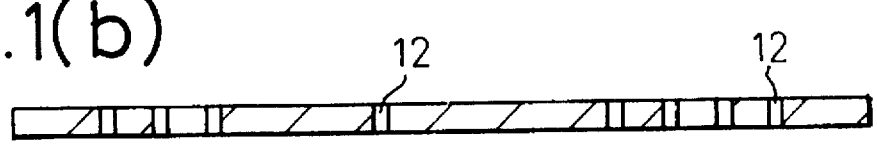

First, aluminum oxide powder, the average grain size of which was approximately 2 μm, was mixed with magnesium oxide (MgO), silica (SiO$_2$) and calcium carbonate (CaCO$_3$). The thus obtained alumina ceramic of 92 weight percent was formed into a green sheet 10 as shown in FIG. 1(a). A large number of through-holes 12, the diameter of which was 360 μm, were formed on this green sheet 10 as shown in FIG. 1(b).

Figure 1C:

Next, aluminum paste 14 made of aluminum powder, the average grain size of which was 10 μm, was charged into these through-holes 12 as shown in FIG. 1(c), and was dried.

Figure 1D:
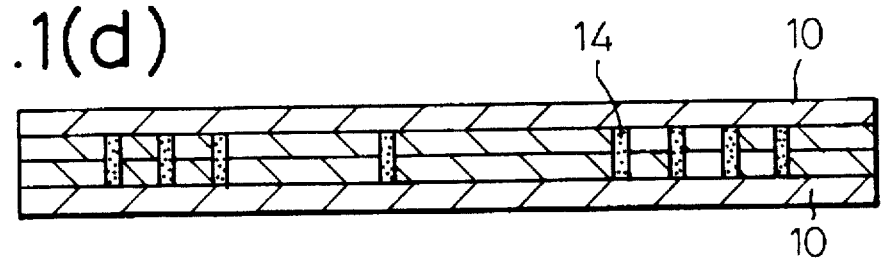

Next, two green sheets 10 charged with the aluminum paste 14 in the above manner were stacked on each other. Further, green sheets 10 on which the aluminum paste 14 was not printed and the through-holes 14 were not formed were stacked on the upper and lower surfaces of the previously stacked green sheets 10. Then the stacked green sheets were thermally pressed and integrated into one body at 60° C. under the pressure of 200 Kgf/cm$^2$ as shown in FIG. 1(d). Since the positions of the through-holes 12 provided on each green sheet 10 coincide with each other, the upper and lower green sheets 10 were communicated with the via.

Figure 1E:
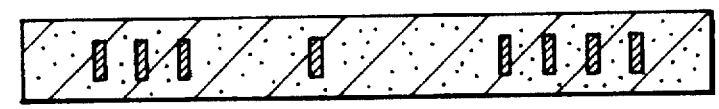

This laminated body of the green sheets 10 was subjected to a binder-removing-treatment processing at 500° C. in the atmosphere. After that, the laminated body of the green sheets 10 was fired at 1560° C. for 2 hours in the atmosphere of dry nitrogen as shown in FIG. 1(e).

Figure 1F:

The upper and lower surfaces of the thus obtained sintered body were polished, so that the end face of the via was exposed onto the surface of the base board. FIG. 1(f) is a sectional view of the ceramic circuit board obtained after polishing. The end face of the via was provided with a silver metallic luster, so that it was observed to be a densified body.

As a result of the investigation to investigate the composition of the via portion by EPMA, a very small amount of nitrogen was mixed and uniformly distributed in the aluminum via. Also, a very small amount of oxygen was found, which was considered to have mixed into the aluminum via in the process of making the samples, for example, in the process of polishing. This mixed oxygen was uniformly distributed. The clearest and most characteristic mixture was silicon. Several points of silicon were locally distributed, and boundaries of the silicon points were clear. Mixtures except for silicon were nitrogen and oxygen, the amounts of which were very small and the distributions were uniform. Therefore, it was considered that the existence of silicon nitride or silicon oxide was a low possibility.

COMPARATIVE EXAMPLE 1

The same laminated body as that shown in FIG. 1(d) was made in the same manner as that of Example 1. This laminated body was processed under the same binder-removing and firing conditions as those for making conventional alumina ceramics. The firing condition is described as follows: The atmosphere was a mixture gas composed of ammonia cracking gas and nitrogen gas. The laminated body was heated to 800° C. in the atmosphere which was maintained to be a moist atmosphere, the dew point of which was 45° C., so that the organic component was easily removed from the laminated body. After that, the atmosphere was maintained to be a dry atmosphere, and the laminated body was fired at 1570° C. for 2 hours.

Upper and lower surfaces of the thus obtained sintered body were polished so that the via was exposed onto the surface of the substrate. A grey zone was observed around the via, and portions having metallic luster were scattered on the end face of the via. Voids were made in a portion of the via. Electrical continuity was checked with a tester, and it was found that the via was not electrically continuous.

EXAMPLE 2

Green sheets were provided in such a manner that aluminum oxide powder, the average grain size of which was approximately 2 μm, was mixed with borosilicate glass powder, the volumetric percent of which was approximately 50 percent with respect to aluminum oxide powder. A laminated body was made of the thus obtained green sheet in the same manner as that of Example 1.

After the laminated sheet was subjected to binder-removing treatment at 500° C. in the atmosphere, it was fired at 980° C. for 2 hours in dry nitrogen gas.

The thus obtained sintered body was polished so that the via end face was exposed onto the surface of the substrate. The via end face was observed to be a densified body having a metallic silver luster.

COMPARATIVE EXAMPLE 2

A laminated body made in the same manner as that of Example 2 was heated to 700° C. in the atmosphere of moist nitrogen gas, the dew point of which was 55° C. Then the atmosphere of moist nitrogen gas was changed to dry nitrogen gas, and the laminated body was fired at 980° C. for 2 hours. Upper and lower surfaces of the thus obtained sintered body were polished, so that the via was exposed onto the surface of the substrate. It was observed that the via end face was black and had no metallic luster. A black or grey extension zone was not observed around the via. Electrical continuity was checked with a tester, and it was found that the electrical resistance of the via was very high.

As understood from the above description, the present invention can provide the following effects. According to the ceramic circuit board and the manufacturing method thereof of the present invention, it is possible to provide a circuit board in which aluminum is used as conductor material, the specific resistance of which is low, and the thermal conductivity of which is high and, further, it is possible to realize a conductor circuit, the conductor loss of which is low, or it is possible to realize a highly efficient thermal via. When aluminum is used as the conductor material of the inner conductor circuit, it is possible to carry out the binder-removing treatment in the atmosphere. Accordingly, in addition to the low cost of aluminum, the manufacturing processes from the binder-removing treatment to the firing can be greatly reduced, so that the manufacturing cost can be lowered.

We claim:

1. A fired ceramic circuit board structure comprising:

an insulating ceramic substrate; and an aluminum wiring surrounded by said substrate, said ceramic circuit board structure being characterized by having been fired at a temperature not lower than 660° C. with said wiring surrounded by a ceramic greensheet precursor of said insulating ceramic substrate.

2. The fired ceramic circuit board according to claim 1 wherein the ceramic substrate comprises at least one of alumina, mullite, cordierite and aluminum nitride.

3. The fired ceramic circuit board according to claim 2, wherein the ceramic substrate further comprises glass phase containing silica.

4. The fired ceramic circuit board according to claim 1, further comprising an exposed surface conductor circuit thereon formed by grinding said insulating ceramic substrate, after firing, to expose the surface conductor circuit.

5. A ceramic circuit board structure comprising:

a solid, sintered body having an internal expanse and a plurality of external surfaces surrounding said internal expanse; and an aluminum conductor element disposed entirely within said internal expanse and out of contact with said external surfaces.

* * * * *

UNITED STATES PATENT AND TRADEMARK OFFICE
CERTIFICATE OF CORRECTION

PATENT NO. : 5,702,807
DATED : Dec. 30, 1997
INVENTOR(S) : HORIUCHI et al.

It is certified that error appears in the above-identified patent and that said Letters Patent is hereby corrected as shown below:

TITLE PAGE:

[73] Assignee: change "Shiko" to --Shinko--.

[56] References Cited, under "Other Publications", the second reference, change "No. 96" to --No. 97--.

Col. 3, line 18, change "he" to --the--.

Col. 5, line 36, after "mullite" change the parenthetical to read: --($3Al_2O_3 \cdot 2SiO_2$)--;
line 38, change the parenthetical to read: --($2MgO \cdot 2Al_2O_3 \cdot 5SiO_2$)--.

Signed and Sealed this

Sixth Day of October, 1998

Attest:

BRUCE LEHMAN

*Attesting Officer*  *Commissioner of Patents and Trademarks*